United States Patent
Steward et al.

(10) Patent No.: US 7,026,975 B1
(45) Date of Patent: Apr. 11, 2006

(54) HIGH SPEED DIGITAL PATH FOR SUCCESSIVE APPROXIMATION ANALOG-TO-DIGITAL CONVERTERS

(75) Inventors: Chad Thomas Steward, Sunnyvale, CA (US); Daniel David Alexander, Gilbert, AZ (US); David Maes, Cupertino, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 10/812,242

(22) Filed: Mar. 29, 2004

(51) Int. Cl.
*H03M 1/38* (2006.01)

(52) U.S. Cl. ........................ 341/161; 341/155
(58) Field of Classification Search ................ 341/155, 341/143, 161, 144, 171, 149, 126, 172, 150; 505/826, 827, 828
See application file for complete search history.

(56) References Cited

U.S. PATENT DOCUMENTS 4,553,128 A * 11/1985 Pilost .......................... 341/161
4,940,983 A * 7/1990 Phillips et al. ............... 341/171
6,559,789 B1 * 5/2003 Somayajula ................. 341/172

OTHER PUBLICATIONS

Grebene, Alan B., "Bipolar and MOS Analog Integrated Circuit Design", 1984, Micro-Linear Corporation, Sunnyvale, California, pp. 853-855, no month.

* cited by examiner

Primary Examiner—Brian Young
(74) Attorney, Agent, or Firm—Blakely, Sokoloff, Taylor & Zafman LLP

(57) ABSTRACT

High speed digital path for successive approximation analog-to-digital converters wherein the successive approximation registers and the switch drivers are combined in set-reset latches having the switch drivers as latch outputs. This reduces the time of each successive approximation by reducing the ripple through time of each stage, thereby increasing the speed of operation of the analog-to-digital converters. As an option, the set-reset latches having the switch drivers as latch outputs may also incorporate level shifting to combine each stage of the successive approximation register, associated switch drivers and level shifters into a single circuit for each stage of the analog-to-digital converter. Various embodiments are disclosed.

24 Claims, 11 Drawing Sheets

NOR BASED SET-RESET LATCH

NAND BASED SET-RESET LATCH

NAND BASED SET-RESET LATCH WITH SET & RST ENABLES

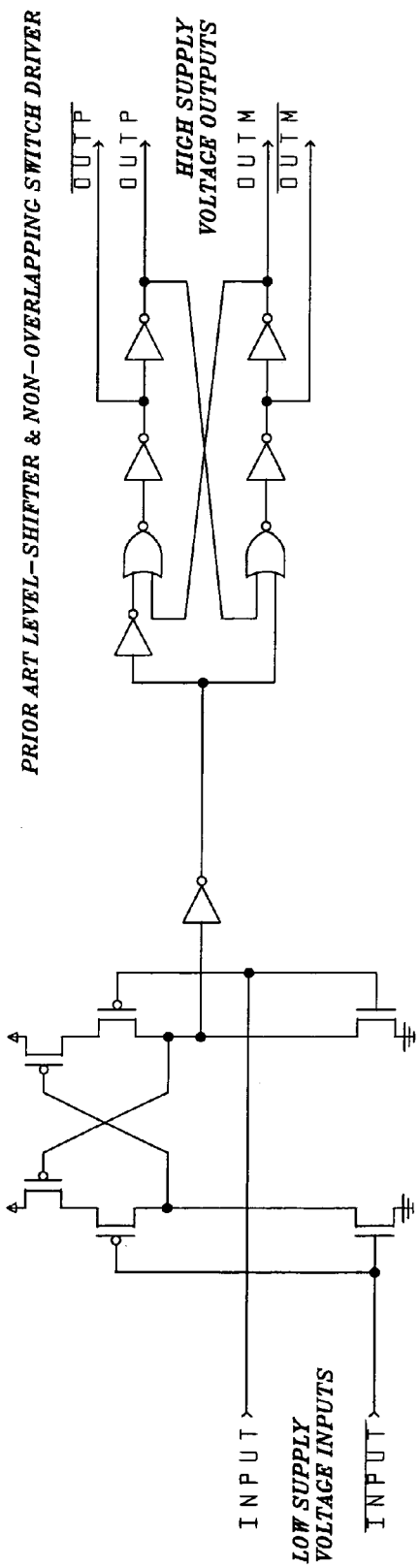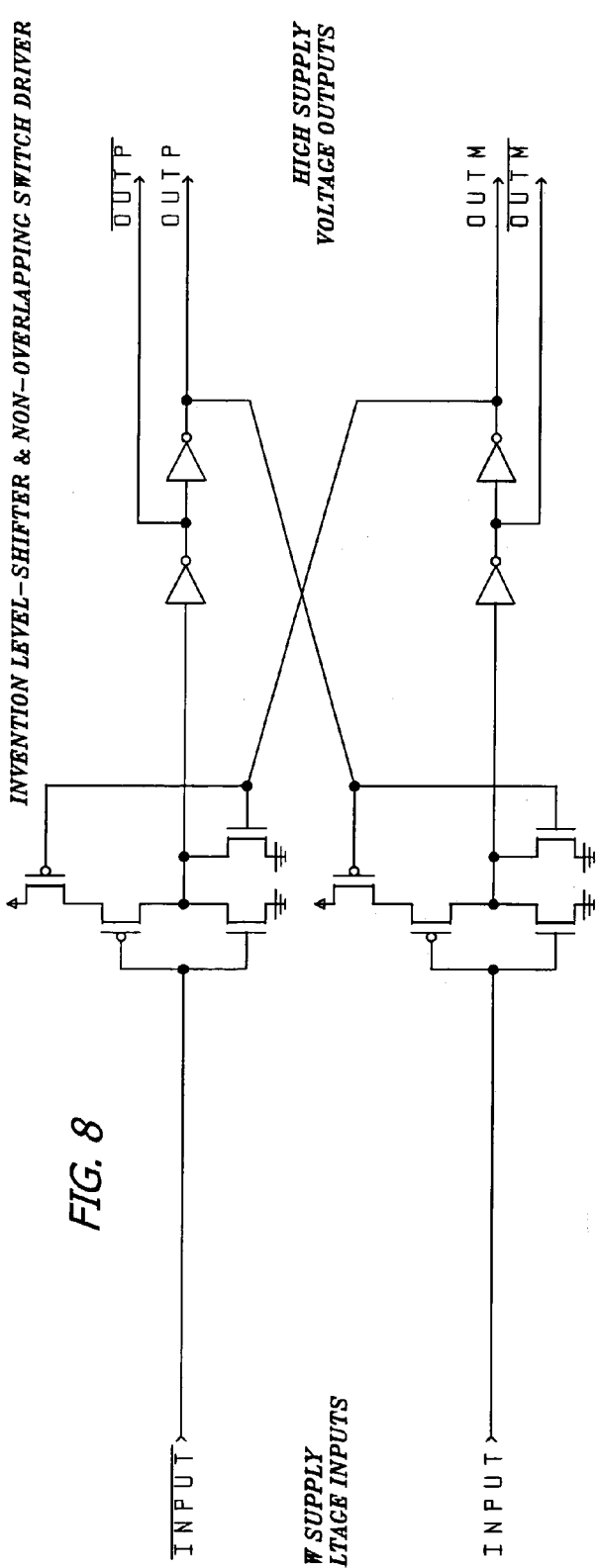
FIG. 8
FIG. 9

HIGH SPEED DIGITAL PATH FOR SUCCESSIVE APPROXIMATION ANALOG-TO-DIGITAL CONVERTERS

BACKGROUND OF THE INVENTION

1. Field of the Invention

The present invention relates to the field of successive approximation analog-to-digital converters.

2. Prior Art

A traditional successive approximation (SAR) analog-to-digital converter (ADC) is schematically shown in FIG. 1. The specific converter shown uses a differential switched capacitor DAC coupled to a comparator having an output coupled to a successive approximation register controlling non-overlapping switch drivers coupled to the switched capacitor DAC. An analog input sample-and-hold is provided, which may be the switched capacitor DAC itself, with the overall SAR ADC being controlled by some form of controller such as the state machine shown.

In a switched capacitor DAC, the capacitor values may be in a binary sequence (radix=2) with one terminal of all capacitors connected to the DAC output. (Reduced radix and mixed radix DACs are also known, to which the present invention is equally applicable.) In a differential switched capacitor DAC as shown, two single-ended DACs operate in opposite polarity so that the outputs of the two DACs may be compared by the comparator, rather than a single output compared to ground as in a single-ended DAC. In operation, the DAC output is switched to ground and the capacitors are all simultaneously connected to and charged to the analog input voltage in the analog input sample-and-hold circuit. Then the grounding is removed and each capacitor is coupled to a reference voltage, one at a time, starting from the most significant bit (the largest capacitor). Typically the capacitance representing the least significant bit is replicated so that the capacitance of the most significant bit is equal to the sum of all of the rest of the capacitances. Thus when the switch drivers connect the capacitance associated with the most significant bit to the reference voltage, the comparator will reverse state if the analog input voltage was less than half the reference voltage, but will not reverse state if it is more than half of the reference voltage $V_{REF}$. If the comparator does reverse state, than the non-overlapping switch driver associated with the most significant bit is reset (the capacitor reconnected to the analog input signal), otherwise it is left set. Either way, the comparator output will remain, or return, respectively, to its original state. Then the next overlapping switch driver is set, and left set if the output of the converter does not change, or reset if the output of the comparator does change, again after which the comparator will remain or return to its original state again. The sequence is repeated until the least significant bit is tested, after which the latches in the successive approximation register controlling the non-overlapping switch drivers will contain the digital value of the analog input signal held in the analog input sample-and-hold. A more complete description of the operation of a switched capacitor DAC analog-to-digital converters may be found in "Bipolar and MOS Analog Integrated Circuit Design" by Alan B. Grebene, a Wiley-Interscience Publication, 1984, starting on page 853.

In such analog-to-digital converters, non-overlapping switch drivers are required to control the switches in the switched capacitor DAC for proper operation of the algorithm. The speed of a successive approximation ADC is normally limited by the sum of the delays through the comparator, the successive approximation register, the non-overlapping drivers and switched capacitor DAC. Such delays can be substantial given the fact that the sequence must be repeated in a non-overlapping fashion for each successive bit in each multiple bit conversion. Additional delays are introduced when level shifters are needed, as when the digital and analog portions of the circuit are driven from separate supply voltages. In that regard, level-shifting is often used because high analog supply voltages are desirable for performance reasons, but small-geometry digital CMOS gates often can't tolerate those larger voltages. Thus, it's often necessary to use larger geometry devices in the analog supply section and add level-shifting at some point between analog and digital sections. Without level-shifting, a high input from the low-voltage section will not be high enough to completely turn off the PMOS devices, allowing static supply current to flow, potentially giving incorrect CMOS logic levels.

FIG. 2 provides an example of a prior art implementation of a successive approximation register 20 and non-overlapping switch drivers 22 as separate functions. Each latch must set before the respective switch driver is initiated, and if the comparator output (FIG. 1) changes state, must reset before the switch drivers are themselves reset.

FIG. 3 provides an example of a prior art implementation of a supply voltage level shift and non-overlapping switch driver as separate functions. The supply voltage level shift is provided by flip-flop circuit 24 powered by typically a higher voltage supply and controlled by lower voltage inputs INPUT and $\overline{\text{INPUT}}$, which may be the Q and $\overline{\text{Q}}$ outputs of successive approximation latches as shown in FIG. 2. The high voltage referenced output of the flip-flop circuit is coupled to the non-overlapping switch drivers 26, also powered from the higher voltage supply.

The feedback connections in the level-shifter of FIG. 3 perform the level-shift as follows. When NMOS transistor Q2 is turned off and NMOS transistor Q1 is turned on, the gate of feedback PMOS transistor Q6 is pulled low, causing the gate of the PMOS transistor Q5 to be pulled all the way to the high supply voltage, completely turning off PMOS transistor Q5. Of course, when NMOS transistor Q1 is turned off and NMOS transistor Q2 is turned on, the opposite sequence happens. The transistors must be sized so that the NMOS devices are strong enough to pull the output low initially until the feedback comes back and fully turns off the PMOS transistors Q5 or Q6.

BRIEF DESCRIPTION OF THE DRAWINGS

FIG. 8 shows a generalized prior art level shifter and non-overlapping switch driver similar to that of FIG. 3.

FIG. 9 showing a generalized present invention circuit equivalent to that of FIG. 8 and similar to that of FIG. 7.

DETAILED DESCRIPTION OF THE PREFERRED EMBODIMENTS

In a binary coded switched capacitor DAC, the capacitor values are in a binary sequence. However the present invention is also applicable to reduced radix and mixed radix DACs. Accordingly, in the description to follow, the reference to a bit, unless the context indicates otherwise, refers to an internal bit of the ADC, which may or may not have a binary weighting, as is well known in the art.

Figure 1:
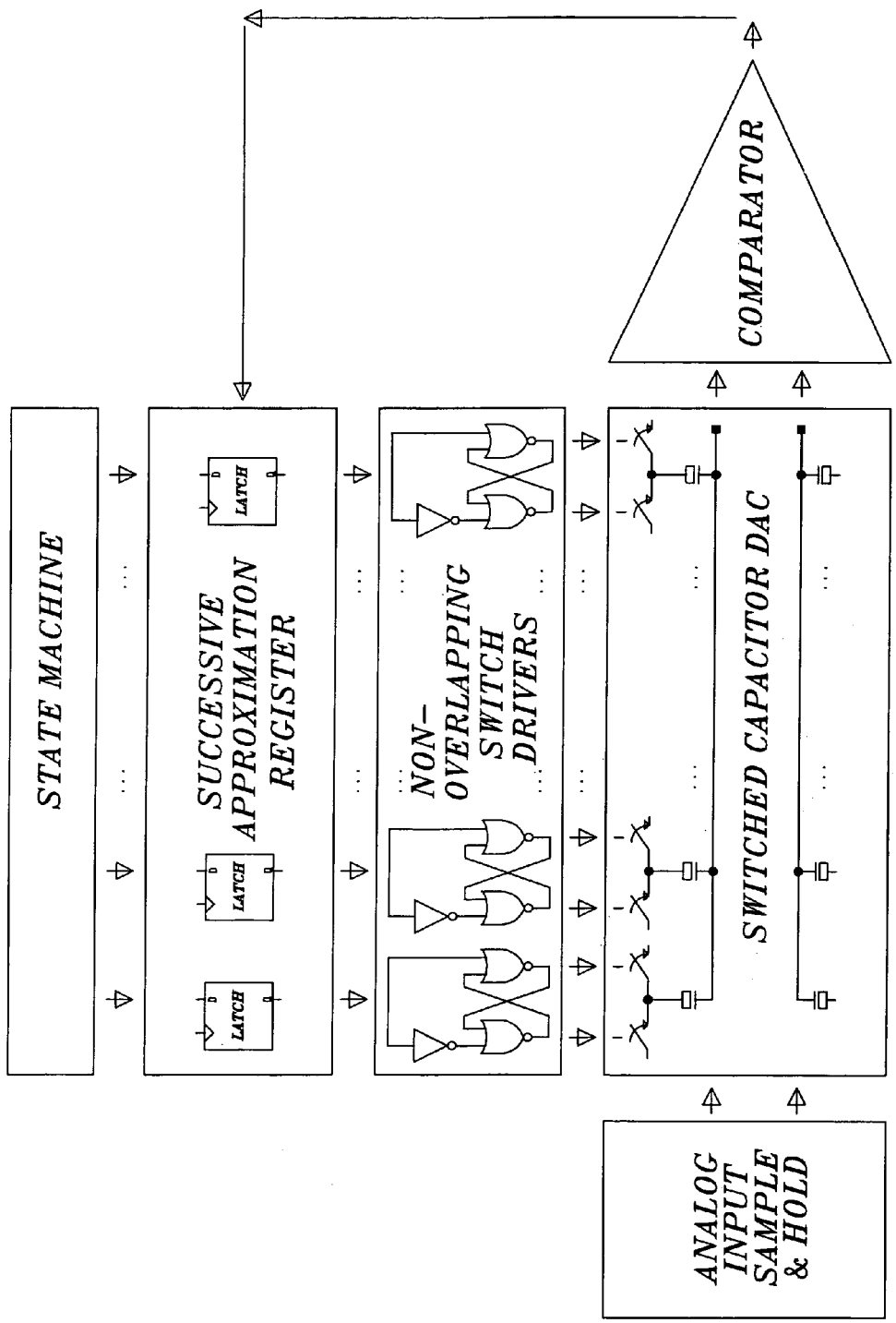
FIG. 1 is a schematic diagram of a traditional successive approximation (SAR) analog-to-digital converter (ADC).
Figure 2:
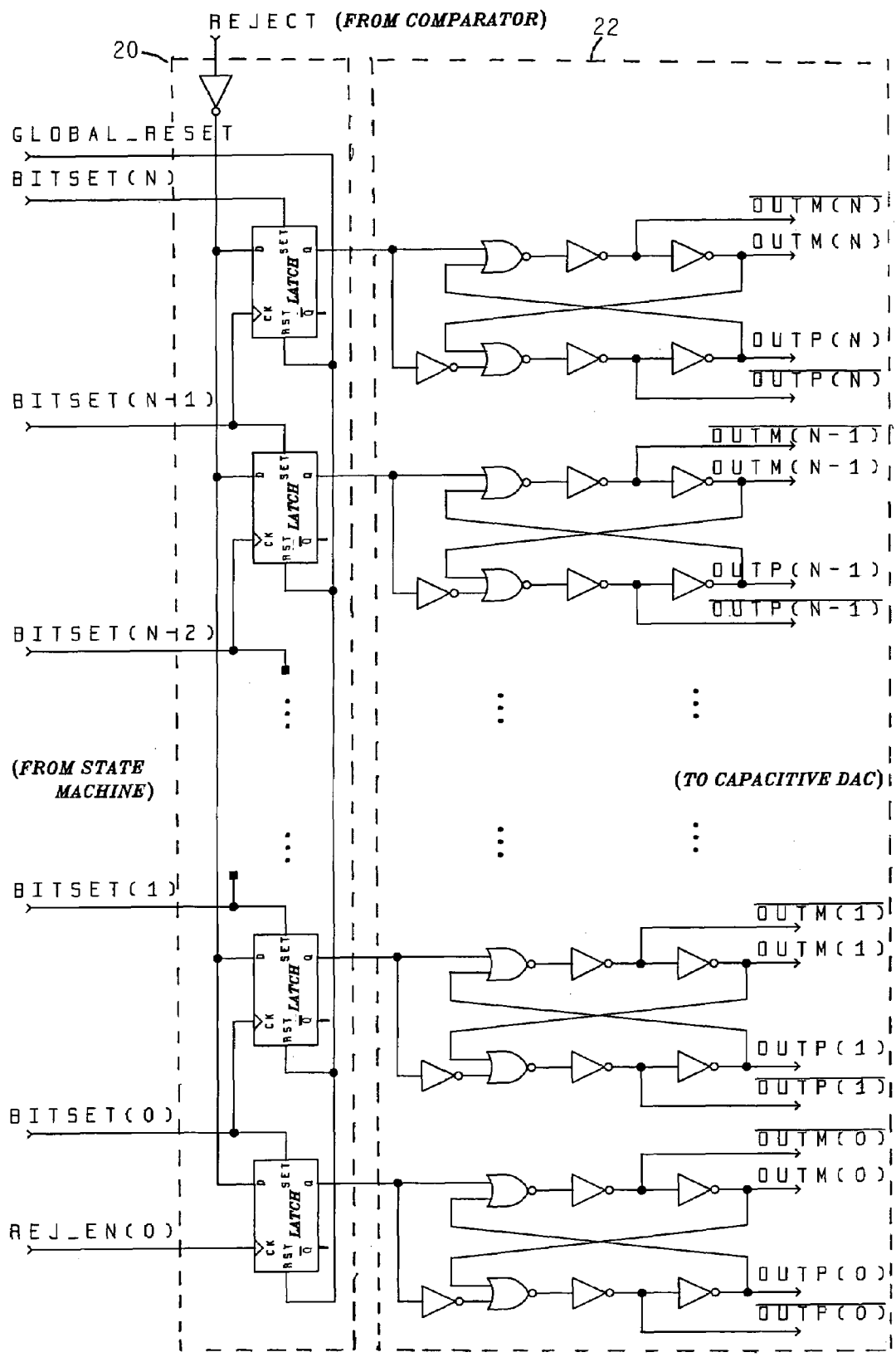
FIG. 2 provides an example of a prior art implementation of successive approximation registers and non-overlapping switch drivers as separate functions.
Figure 4:
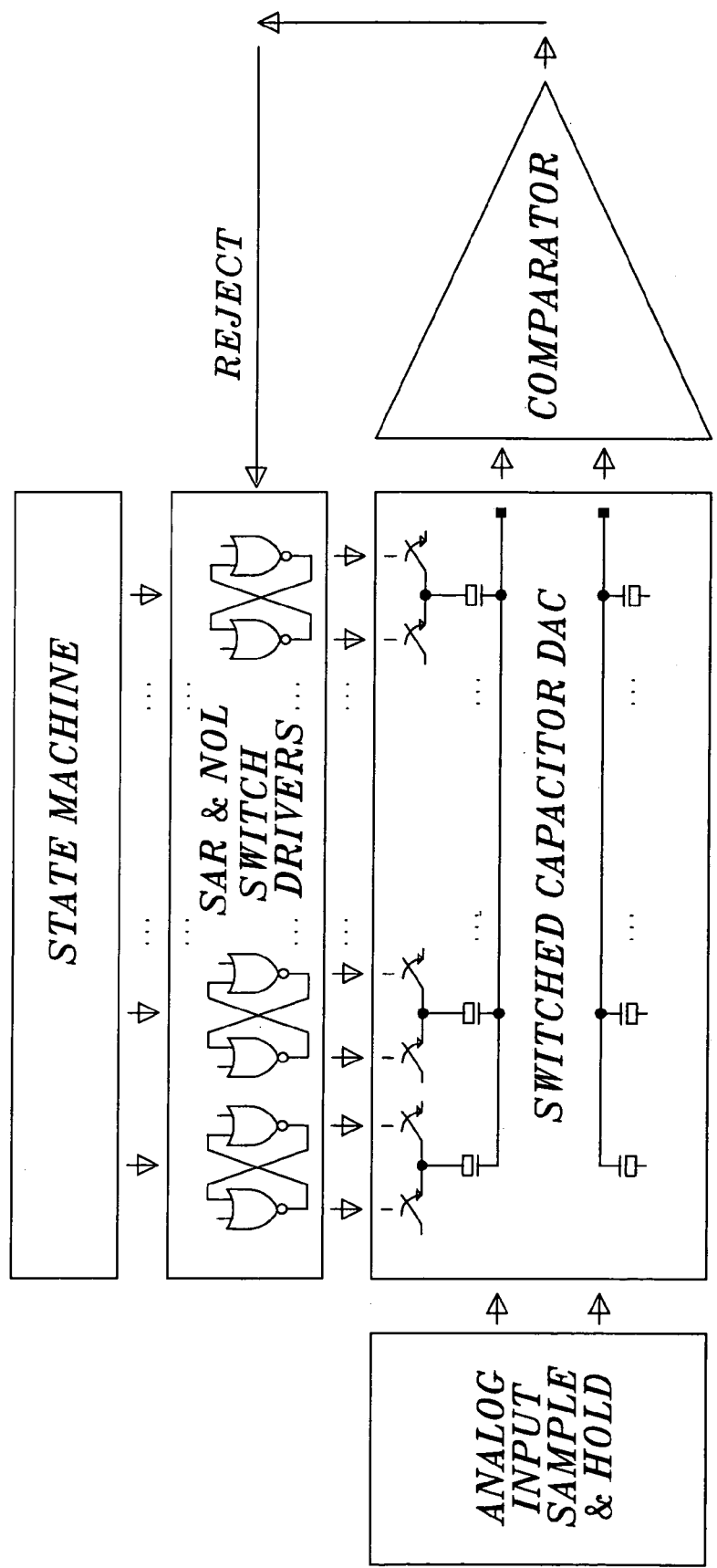
FIG. 4 illustrates an embodiment of the present invention using combined set-reset latches and non-overlapping switch drivers.

Now referring to FIG. 4, an exemplary embodiment of the present invention also using a differential switched capacitor DAC may be seen (though the present invention is also applicable to ordinary or non-differential DACs). In accordance with this embodiment, the successive approximation registers and non-overlapping switch drivers of the prior art (see FIG. 1) are combined into set-reset latches and switch drivers, reducing the time of response on each successive approximation, thereby increasing the speed of operation of the ADC. Thus the output of the comparator is directly coupled to the SAR and NOL switch drivers (combined successive approximation registers and non-overlapping switch drivers) and may be directly controlled by the state machine or other controller to control the switched capacitor DAC.

Figure 5:
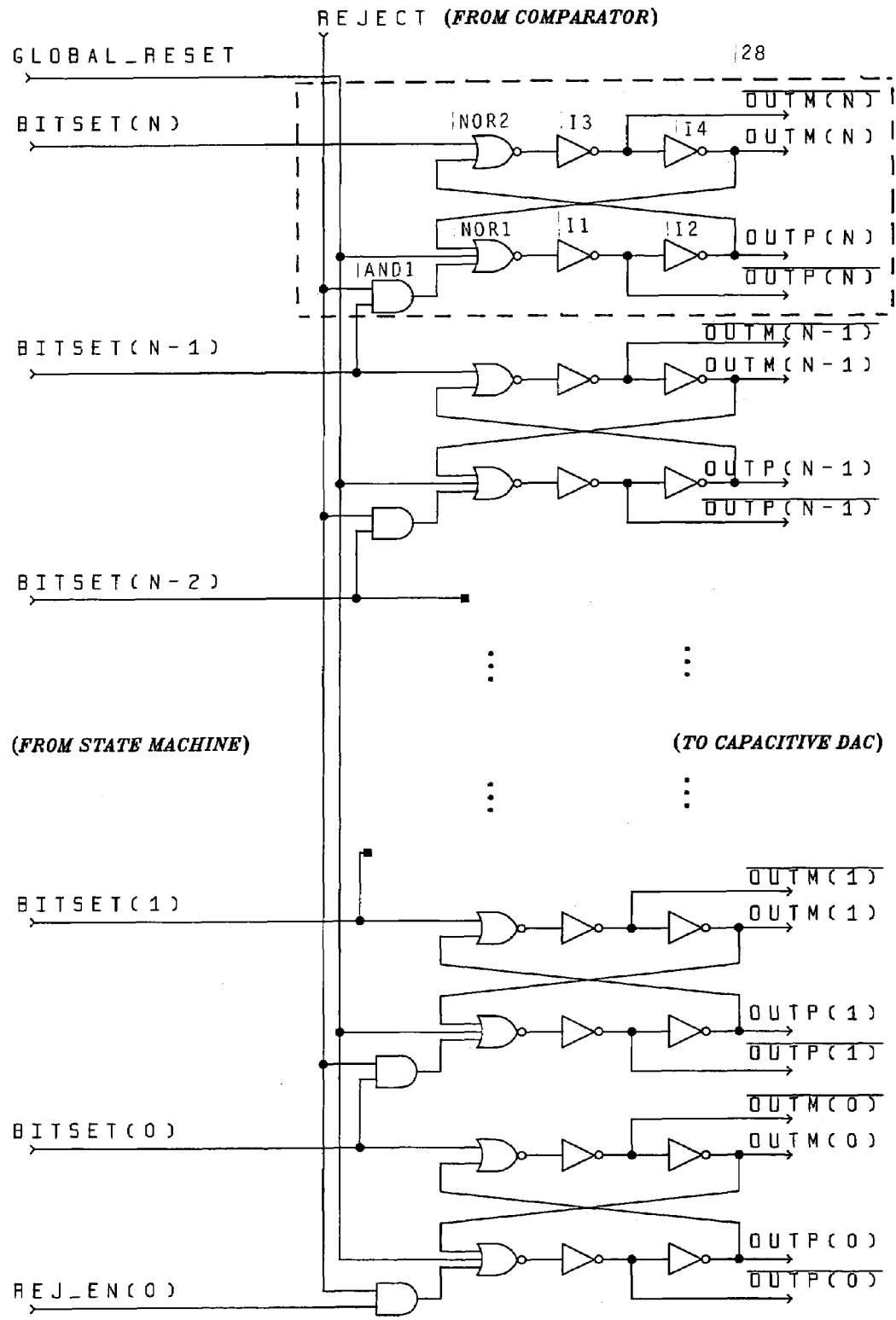
FIG. 5 illustrates a NOR gate based combined set-reset latches and non-overlapping switch drivers.

One embodiment of combined SAR and NOL switch drivers may be seen in FIG. 5. A typical combined register bit and associated switch driver is shown within dashed line 28. This circuit, of course, is replicated for each bit of the ADC as may be seen in FIG. 4. The switch drivers are non-overlapping in the positive logic sense that an OUTP(n) and corresponding OUTM(n) are never both high, and in the negative logic/sense that an $\overline{OUTP(n)}$ and corresponding $\overline{OUTM(n)}$ are never both low.

At the beginning of a conversion sequence, all the BITSET signals from the state machine are low. A GLOBAL_RESET pulse drives the output of NOR gate NOR1 low, and thus the output of inverter I1 high, which provides the output signal $\overline{OUTP(N)}$ to the switched capacitor array. The high output of inverter I1 also drives the output of inverter I2 low, providing the output signal OUTP(N). Thus both inputs to NOR gate NOR2 are low, providing a high input to inverter I3, which provides a low output for the signal $\overline{OUTM(N)}$, with inverter I4 providing a high output for the output signal OUTM(N) and providing a second high input to NOR gate NOR1, thereby holding the latch and switch drivers for bit N in the reset state after the GLOBAL_RESET signal goes low. All other switch drivers are simultaneously reset the same way at the same time, erasing the prior analog to digital conversion previously held in the combined set-reset latches and switch drivers in readiness for the next conversion of a new analog value in the analog input sample-and-hold circuit (FIG. 4).

To start the conversion process, the state machine will provide a BITSET(N) pulse, driving the output of NOR gate NOR2 low, the output of inverter I3 high and the output of inverter I4 low. Since at this time the bit set signal BITSET(N−1) is low, the output of AND gate AND1 is low, as is the GLOBAL_RESET signal, so that the output of NOR gate NOR1 will be high, the output of inverter I1 low and the output of inverter I2 high, thus changing the states of the four switch signals for the most significant bit of the digital-to-analog converter (see FIG. 4). If the most significant bit is zero, the comparator (see FIG. 4) will change state. This provides the REJECT signal shown in FIG. 5. Now when the bit select signal BITSELECT(N) goes low and BITSELECT(N−1) goes high, both inputs to AND gate AND1 will be high, thereby providing a high input to NOR gate NOR1. This is equivalent to a global reset signal for the switch drivers for that bit only, resetting the switch drivers for that bit. At the same time, the BITSELECT(N−1) pulse initiates the setting of the switch drivers for the next bit to initiate the same sequence for bit N−1. If, on the other hand, the most significant (N) bit is a 1, the REJECT signal from the comparator will not change state. Consequently, the output of AND gate AND1 will remain low and the switch drivers for the most significant bit will not be reset. Consequently the most significant bit has been determined and effectively stored in the combined set-reset latch and switch drivers, with the process being successively repeated for the remaining bits.

From the description above, it may be seen that in this embodiment, the testing of the state of the REJECT signal for any one bit is initiated by the same BITSET signal that initiates the setting of the combined set-reset latch and switch drivers for the next bit. For bit 0, there is no "next" bit. Accordingly, the state machine may be programmed to provide a REJ_EN(0) signal equivalent to a further BITSET signal to test the state of the REJECT signal for the 0 bit to reset or not reset the combined set-reset latch and switch drivers as appropriate for the final step in an analog to digital successive approximation conversion. Now, as another analog sample is taken, the digital value may be clocked out of the combined set-reset latches and switch drivers and the combined set-reset latches and switch drivers reset to start another analog to digital conversion.

Figure 6A:
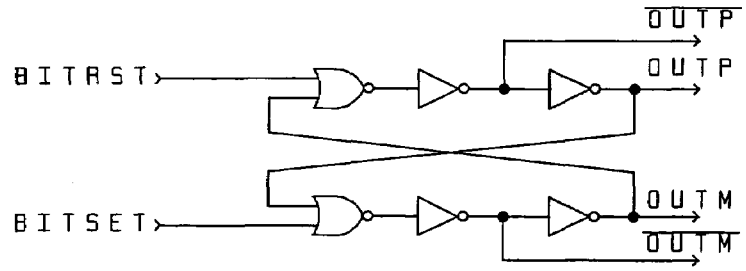
FIGS. 6a through 6f are examples of some combined set-reset latches and switch drivers that may be used in the present invention.
Figure 6B:
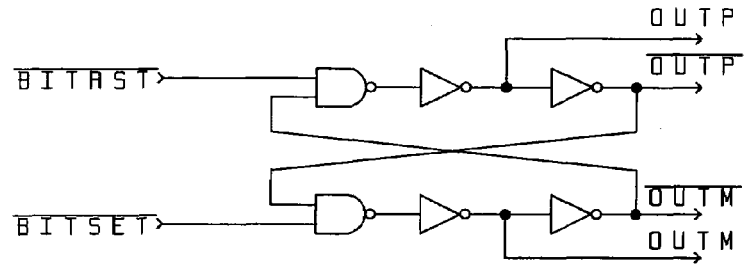
Figure 6C:
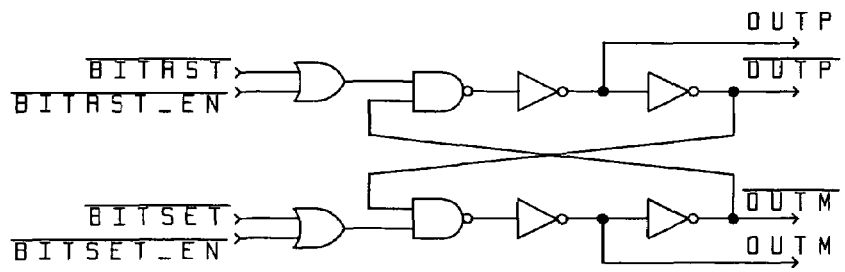
Figure 6D:
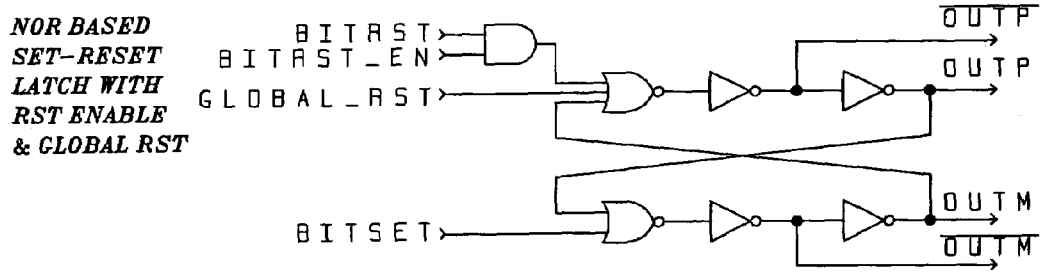
Figure 6E:
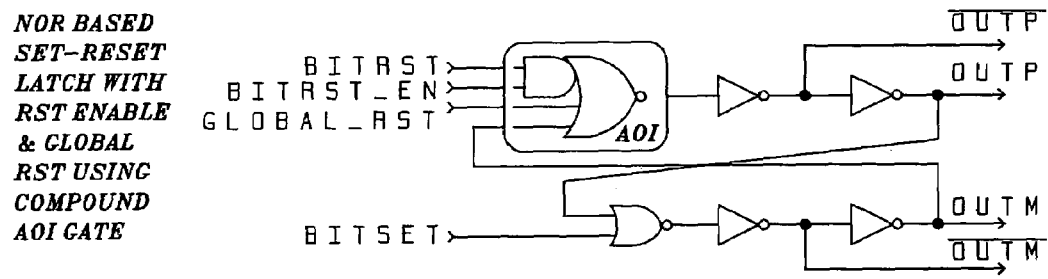
Figure 6F:
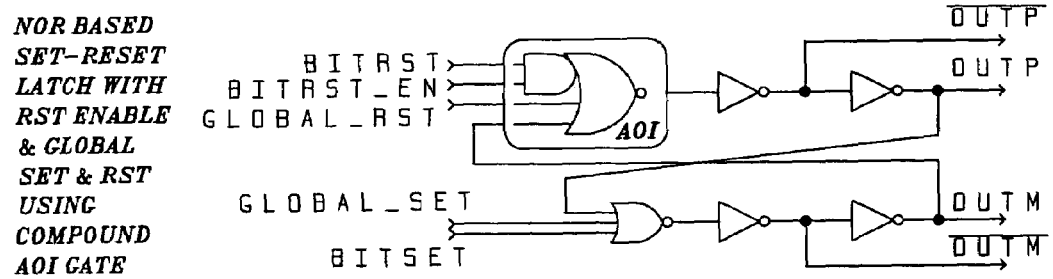

FIGS. 6a through 6f are examples of some combined set-reset latches and switch drivers that may be used in the present invention. FIG. 6a is a NOR gate based set-reset latch, FIG. 6b shows a NAND gate based set-reset latch, and FIG. 6c shows a NAND gate based set-reset latch with reset enable and set enable. FIG. 6d shows a NOR gate based set-reset latch with reset enable and global reset controls like that used in the example of FIG. 5, and FIG. 6e shows a NOR gate based set-reset latch with reset enable and global reset controls using a hybrid gate, specifically a compound AOI gate. (An AOI gate logically is an AND-OR-Invert gate, though typically is realized by a circuit not having the intermediate AND signal suggested by its name.) Finally FIG. 6f shows a NOR gate based set-reset latch with reset enable and global set and reset controls using a compound AOI gate. Any of these set-reset latches may be easily adapted for use in an embodiment of the invention like that of FIG. 4 by one of ordinary skill in the art.

Figure 7:
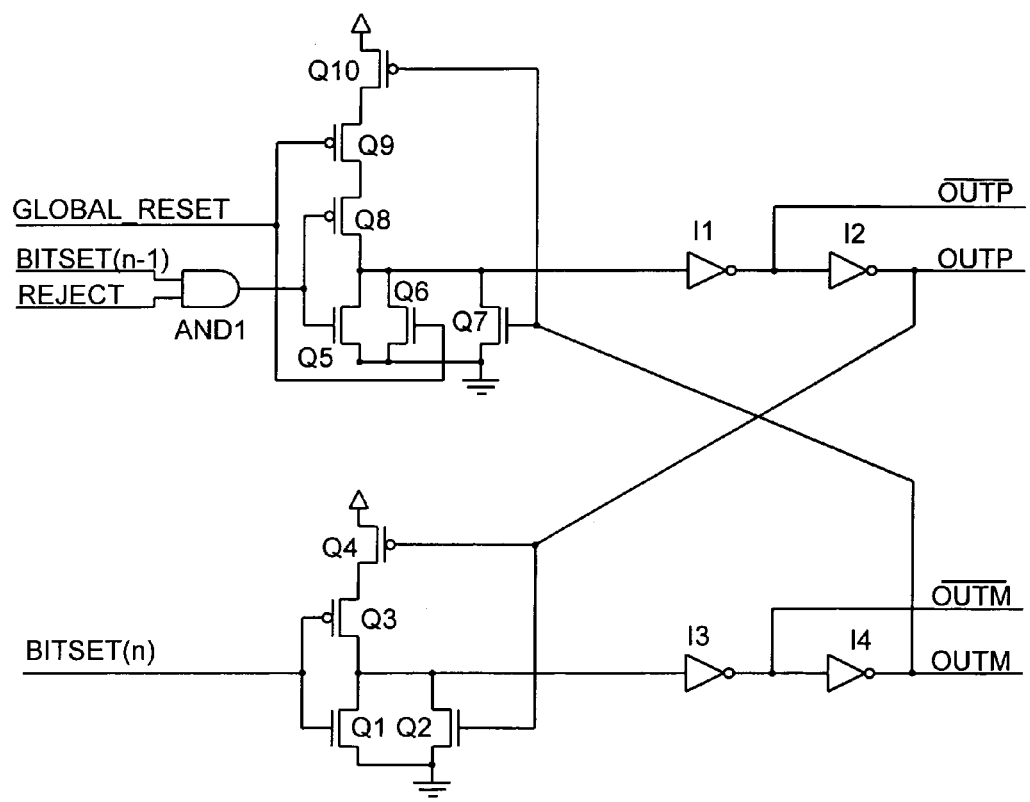
FIG. 7 illustrates a NOR gate based combined set-reset latch and switch drivers duplicating the function of the NOR gate based combined set-reset latches and switch drivers of FIG. 5 and further incorporating a level shift capability.

Now referring to FIG. 7, a NOR gate based combined set-reset latch and switch drivers duplicating the function of the NOR gate based combined set-reset latches and switch drivers of FIG. 5, but further incorporating a level shift capability may be seen. The GLOBAL_RESET, BITSET and REJECT signals may all be referenced to a first supply voltage, and the transistor level NOR gates referenced to a second, typically higher voltage power supply. Thus the switch driver signals may be higher voltage signals if desired.

In the circuit of FIG. 7, the inverters I1 through I4 are connected and function the same as the inverters I1 through I4 of FIG. 5. Considering the circuit comprising transistors Q1 through Q4, if either BITSET(n) or OUTP or both are high, transistor Q1 or transistor Q2 or both will be on and transistor Q3 or transistor Q4 or both will be off. Therefore if any input is high, the output will be low. If all inputs are low, the output will be high, all in accordance with NOR gate logic states. The operation of the circuit comprising transistors Q5 through Q10 is similar, differing only in that it has three inputs, all of which must be low to turn off all of transistors Q5, Q6 and Q7 and to turn on all of transistors Q8, Q9 and Q10 to provide a high state output. Finally, AND gate AND1 performs the same function as AND gate AND1 of FIG. 5. Of course for n=0, the signal BITSET(n−1) becomes the signal REL_EN(0) of FIG. 5.

In the embodiment of FIG. 7, transistors Q3, Q8 and Q9 will not be completely turned off by a high on the low-voltage inputs. The feedback connections serve to completely turn off Q4 and Q10 and cut off the supply current path, completing the level-shift. Also, while this example is for NOR gate based combined set-reset latch and switch drivers with level shifting, other circuits such as those of FIGS. 6b through 6f may be adapted for such combined use.

Figure 3:
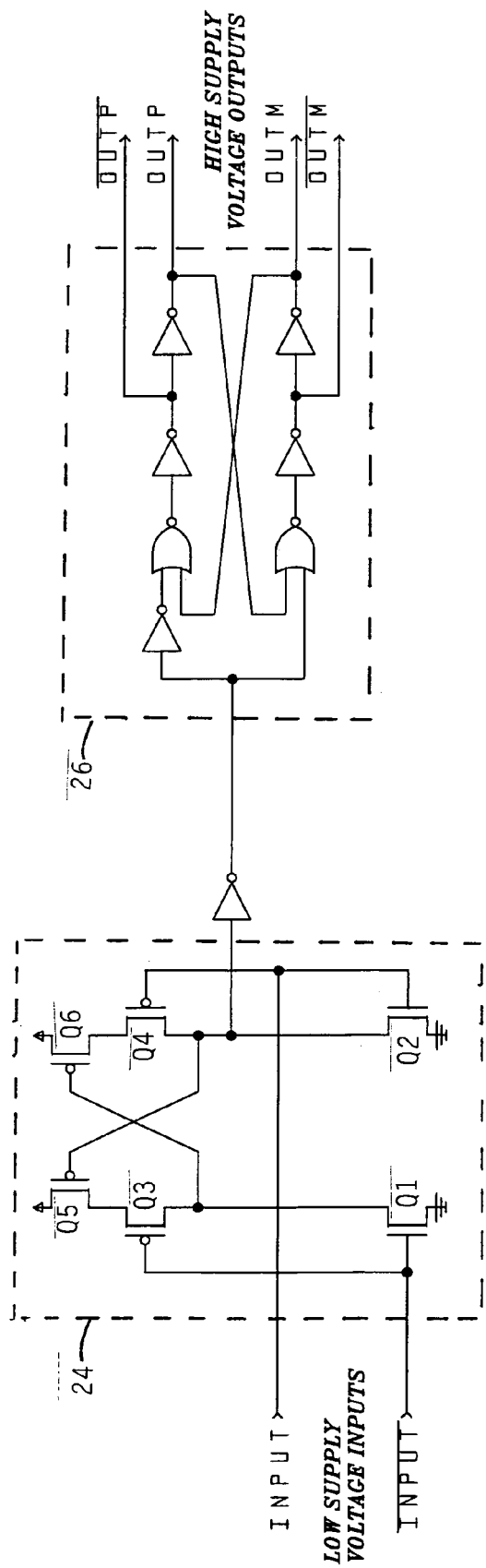
FIG. 3 provides an example of a prior art implementation of a supply voltage level shift and non-overlapping switch drivers as separate functions.
Figure 10:
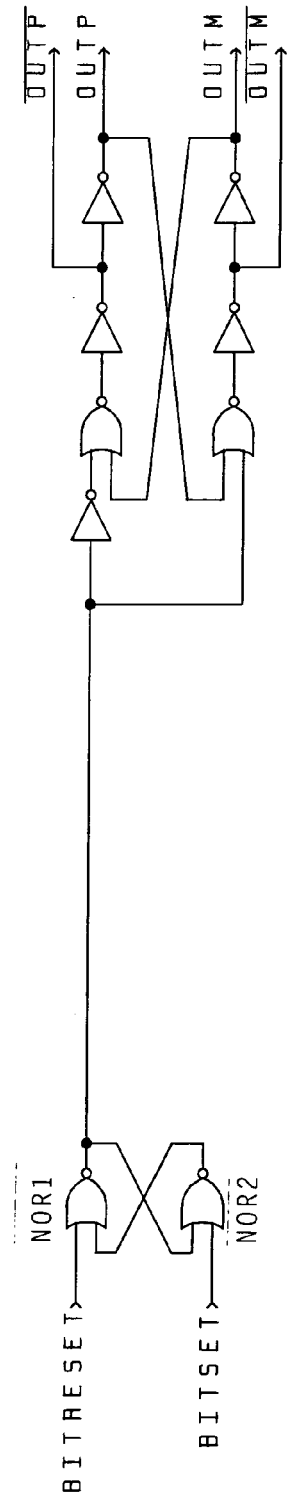
FIG. 10 shows a generalized prior art latch and non-overlapping switch driver.
Figure 11:
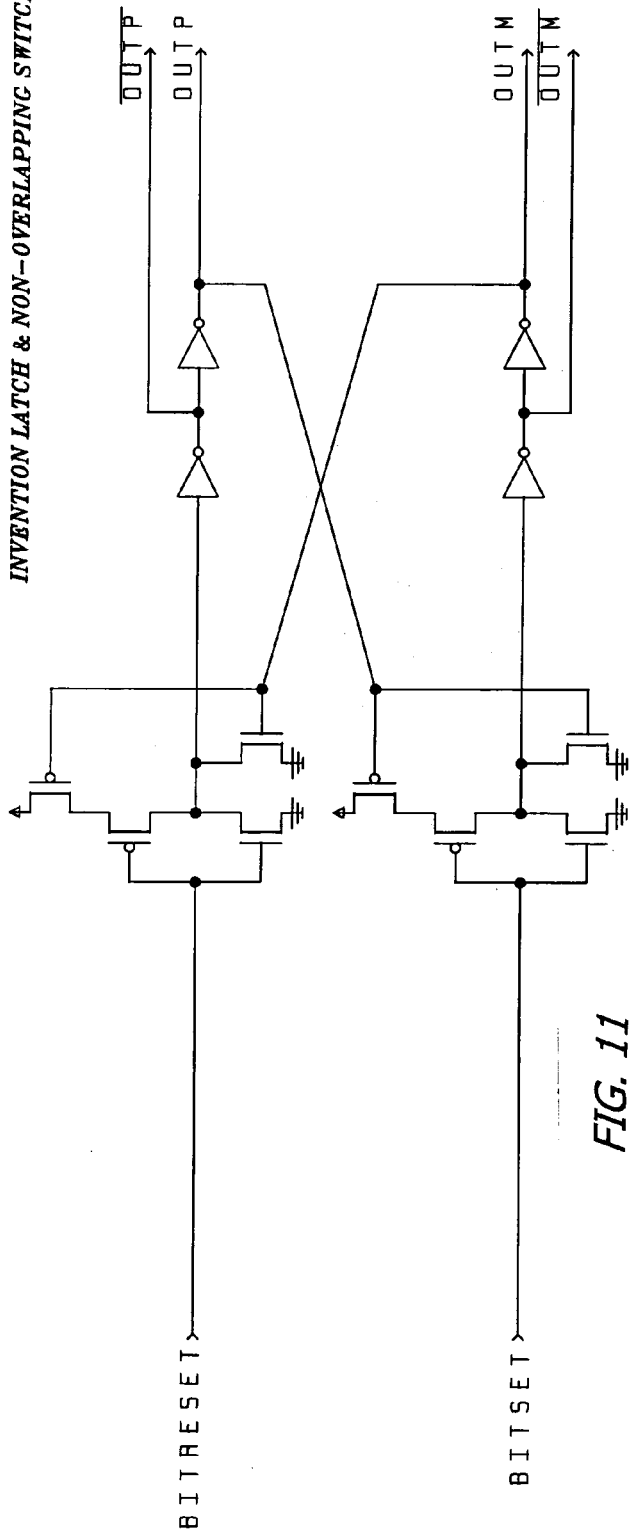
FIG. 11 showing a generalized present invention latch and non-overlapping switch driver.
Figure 12:
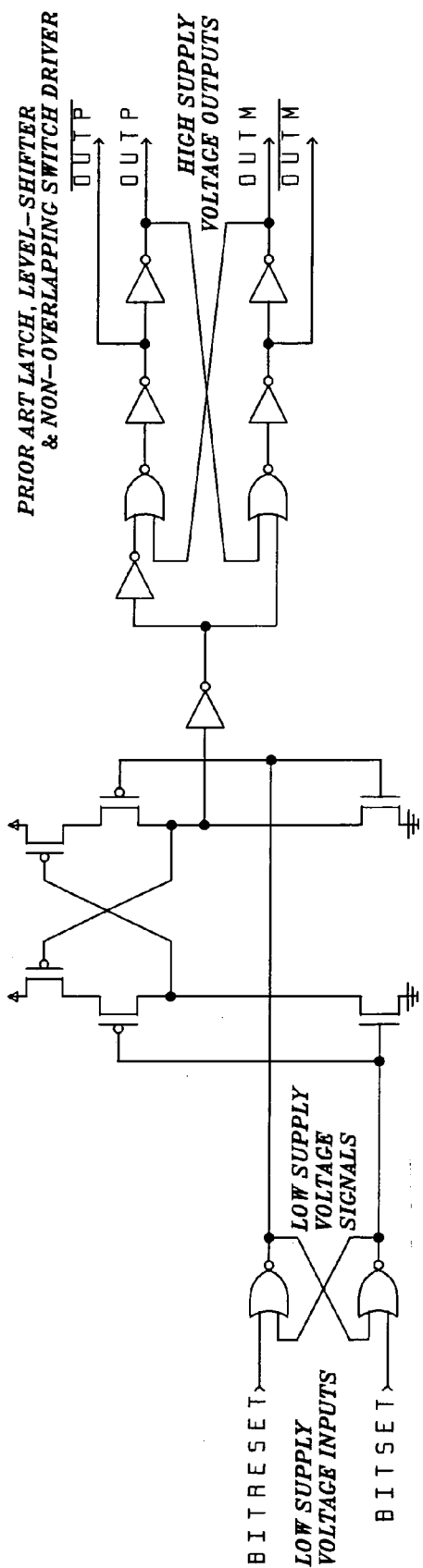
FIG. 12 shows a prior art latch, level shifter and non-overlapping switch driver.
Figure 13:
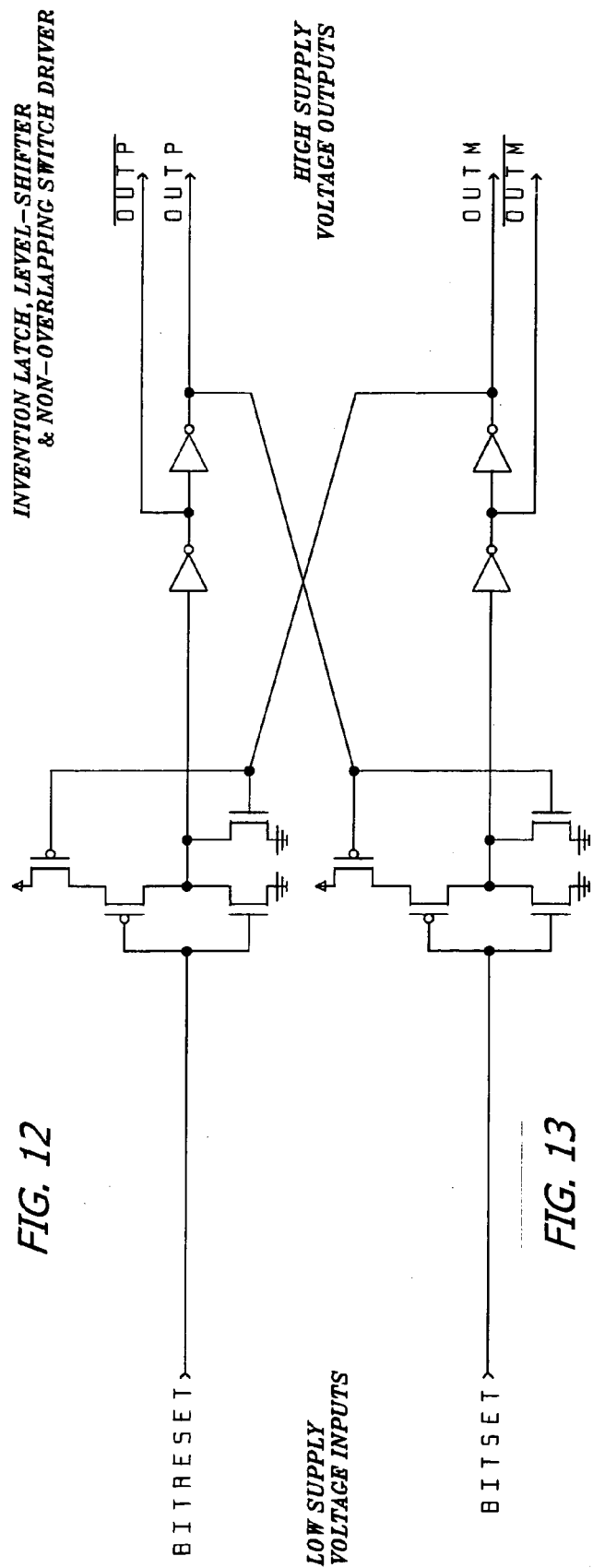
FIG. 13 shows a generalized latch, level shifter and non-overlapping switch driver in accordance with the present invention.

Thus it may be seen that the present invention provides set-reset latches in successive approximation ADCs that themselves provide the non-overlapping switch driver outputs as latch outputs, rather than having each latch drive a separate non-overlapping switch driver circuit. The present invention further provides the option of adding level shifting to the non-overlapping switch driver outputs of the set-reset latches, if desired. The latches themselves may be used in circuits other than ADCs. By way of example, FIG. 8 shows a more generalized prior art level shifter and non-overlapping switch driver similar to that of FIG. 3, with FIG. 9 showing a present invention equivalent circuit similar to that of FIG. 7. FIG. 10 shows a prior art latch and non-overlapping switch driver, NOR gates NOR1 and NOR2 being coupled as a set-reset latch, with FIG. 11 showing a present invention equivalent. FIG. 12 shows a prior art latch, level shifter and non-overlapping switch driver, with FIG. 13 showing the present invention equivalent. In that regard, FIG. 13 is similar to FIG. 11, though with the circuit being powered from a different voltage than the logic supplying the input controls, typically a higher voltage.

While certain preferred embodiments of the present invention have been disclosed and described herein, it will be understood by those skilled in the art that various changes in form and detail may be made therein without departing from the spirit and scope of the invention.

The invention claimed is:

1. A successive approximation analog-to-digital converter comprising:
    an analog sample and hold circuit;
    a switched capacitor DAC having an input coupled to an output of the sample and hold circuit;
    a comparator having an input coupled to an output of the switched capacitor DAC;
    a plurality of set-reset latches, each set-reset latch being responsive to a combination of control signals and the output of the comparator and configured to provide first and second switch driver signals having first and second states as set-reset latch outputs, the first switch driver signal being in the first state when the set-reset latch is set, the second switch driver signal being in the first state when the set-reset latch in reset, the first and second switch driver signals not being in the first state at the same time;
    the switch driver signals being coupled to control the switched capacitor DAC.

2. The converter of claim 1 wherein the switched capacitor DAC is a differential switched capacitor DAC, the set-reset latches each, also providing third and fourth switch signals, the third switch driver signal being in the first second when the set-reset latch in set, the fourth switch driver signal being in the second state when the set-reset latch in reset, the third and forth switch driver signals not being in the second state at the same time.

3. The converter of claim 1 further comprised of a controller coupled to provide the control signals.

4. The converter of claim 3 wherein the controller is a state machine.

5. The converter of claim 1 wherein the set-reset latches have switch driver signal outputs that are level shifted in comparison to the combination of control signals and the output of the comparator.

6. The converter of claim 1 wherein the set-reset latches are NOR gate based latches.

7. The converter of claim 1 wherein the set-reset latches are NAND gate based latches.

8. The converter of claim 1 wherein the switched capacitor DAC is a binary coded DAC.

9. The converter of claim 1 wherein the switched capacitor DAC is a reduced radix DAC.

10. The converter of claim 1 wherein the switched capacitor DAC is a mixed radix DAC.

11. A successive approximation analog-to-digital converter comprising:
    an analog sample and hold circuit;
    a differential switched capacitor DAC having an input coupled to an output of the sample and hold circuit;
    a comparator having an input coupled to an output of the switched capacitor DAC;
    a plurality of set-reset latches, each set-reset latch being responsive to a combination of control signals and the output of the comparator and configured to provide first, second, third and fourth switch driver signals as set-reset latch outputs, each switch driver signal having first and second states as set-reset latch outputs, the first switch driver signal being in the first state when the set-reset latch in set, the second switch driver signal being in the first state when the set-reset latch in reset, the first and second switch driver signals not being in the first state at the same time, the third switch driver signal being in the second state when the set-reset latch in set, the fourth switch driver signal being in the second state when the set-reset latch is reset, the third and forth switch driver signals not being in the second state at the same time; and,
    a controller coupled to provide the control signals;
    the switch driver signals being coupled to control the switched capacitor DAC.

12. The converter of claim 11 wherein the set-reset latches have latch outputs that are level shifted in comparison to the combination of control signals and the output of the comparator.

13. The converter of claim 11 wherein the set-reset latches are NOR gate based latches.

14. The converter of claim 11 wherein the set-reset latches are NAND gate based latches.

15. The converter of claim 11 wherein the switched capacitor DAC is a binary coded DAC.

16. The converter of claim 11 wherein the switched capacitor DAC is a reduced radix DAC.

17. The converter of claim 11 wherein the switched capacitor DAC is a mixed radix DAC.

18. In a successive approximation analog-to-digital converter, the improvement comprising:
   a plurality of combined set-reset latches and switch drivers responsive to a combination of control signals and the output of a comparator to provide successive approximation switch signals to a switched capacitor DAC, each combined set-reset latch and switch driver having a set-reset latch having first and second switch driver signals as latch outputs, the first switch driver signal being in the first state when the set-reset latch is set, the second switch driver signal being in the first state when the set-reset latch in reset, the first and second switch driver signals not being in the first state at the same time.

19. The improvement of claim 18 wherein the set-reset latches having switch driver signals as latch outputs have latch outputs that are level shifted in comparison to the inputs to the set-reset latches.

20. A method of providing latched switch driver signals comprising:
   providing a set-reset latch responsive to latch control signals referenced to a first voltage and having first and second latch output signals, the first latch output signal being in the first state when the set-reset latch in set, the second latch output signal being in the first state when the set-reset latch in reset, the first and second latch output signals not being in the first state at the same time;
   powering the latch at a second voltage different than the first voltage;
   coupling the latch output signals as switch driver signal outputs.

21. The method of claim 20 wherein the second voltage is higher than the first voltage.

22. The method of claim 20 wherein the first state is a high logic state.

23. The method of claim 20 wherein the first state is a low logic state.

24. The method of claim 20 wherein the set-reset latch also has third and fourth latch output signals, the third latch output signal being in the second state when the set-reset latch in set, the fourth latch output signal being in the second state when the set-reset latch in reset, the third and forth latch output signals not being in the second state at the same time.

* * * * *